United States Patent
Meyer et al.

(10) Patent No.: US 9,831,467 B2
(45) Date of Patent: Nov. 28, 2017

(54) ENCAPSULATED SEMICONDUCTOR DEVICE AND ENCAPSULATION METHOD

(71) Applicant: OLEDWORKS GMBH, Aachen (DE)

(72) Inventors: Jens Meyer, Cologne (DE); Rainald Manfred Gierth, Köln (DE); Stefan Peter Grabowski, Neuss (DE); Herbert Lifka, Eindhoven (NL); Peter Van De Weijer, Heeze (NL); Petrus Cornelis-Paulus Bouten, Eindhoven (NL); Volker Lambert Van Elsbergen, Aachen (DE); Manfred Stephan Ruske, Kerpen (DE); Soren Hartmann, Baesweiler (DE)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 15/112,104

(22) PCT Filed: Jan. 13, 2015

(86) PCT No.: PCT/EP2015/050469
§ 371 (c)(1),
(2) Date: Jul. 15, 2016

(87) PCT Pub. No.: WO2015/107035
PCT Pub. Date: Jul. 23, 2015

(65) Prior Publication Data
US 2016/0343988 A1    Nov. 24, 2016

(30) Foreign Application Priority Data

Jan. 16, 2014 (EP) .................................... 14151355

(51) Int. Cl.
*H01L 27/32* (2006.01)
*H01L 51/52* (2006.01)
(Continued)

(52) U.S. Cl.
CPC ...... *H01L 51/5256* (2013.01); *H01L 51/0097* (2013.01); *H01L 51/448* (2013.01); *H01L 2251/5338* (2013.01); *H01L 2251/566* (2013.01)

(58) Field of Classification Search
CPC .............. H01L 23/564; H01L 51/5253; H01L 2224/02205; H01L 27/32
See application file for complete search history.

(56) References Cited

U.S. PATENT DOCUMENTS

| | | | |
|---|---|---|---|
| 2002/0140347 A1 | 10/2002 | Weaver | |
| 2015/0195915 A1* | 7/2015 | Namkung | ............... B32B 37/26 361/750 |

FOREIGN PATENT DOCUMENTS

| | | |
|---|---|---|
| EP | 2 445 029 A1 | 4/2012 |
| WO | 2013/046545 A1 | 4/2013 |

OTHER PUBLICATIONS

Extended European Search Report issued in EP Application No. 14151355.6 dated Jun. 26, 2014, 6 pages.
(Continued)

*Primary Examiner* — Hoai V Pham (57) ABSTRACT

The present invention relates to an encapsulated semiconductor device (20) provided on a flexible substrate (1), a method of providing an at least partially encapsulated semiconductor device (20) on a flexible substrate (1) and a software product for providing an at least partially encapsulated semiconductor device (20) on a flexible substrate (1). In a preferred embodiment, an encapsulation method is presented in which the organic layer (3) of an inorganic/organic/inorganic multilayer barrier (5) on a plastic foil (1) as a substrate is removed at the edges of an OLED (13). The edges are subsequently sealed with a standard TFE process to encapsulate the OLED (13). This enables cuttable OLEDs (20) that are cut out of a larger plastic substrate (1) and gives
(Continued)

a method to reduce side leakage in OLEDs (20) that have been manufactured in a roll-to-toll process.

11 Claims, 9 Drawing Sheets

(51) Int. Cl.
  *H01L 51/00* (2006.01)
  *H01L 51/44* (2006.01)

(56) References Cited

OTHER PUBLICATIONS

International Search Report and Written Opinion issued in International Application No. PCT/EP2015/050469 dated Mar. 23, 2015, 9 pages.

* cited by examiner

ENCAPSULATED SEMICONDUCTOR DEVICE AND ENCAPSULATION METHOD

FIELD OF THE INVENTION

The present invention relates to an encapsulated semiconductor device on a flexible substrate, in particular an encapsulated organic light emitting diode device provided on a flexible substrate, and to a method of providing an at least partially encapsulated semiconductor device like an organic light emitting diode device on a flexible substrate.

BACKGROUND OF THE INVENTION

Organic light emitting diode devices (in the following referred to as OLED device or simply OLED) can be made on flexible substrates. One prominent option is to use plastic substrates. Similarly, also other semiconductor devices (in particular organic semiconductor devices) can be provided on flexible substrates. Particular examples are photovoltaic devices and particularly organic photovoltaic devices (OPV).

An advantage of using plastic substrates lies in the possibility of using transparent plastics.

However, a disadvantage of using current plastics lies in that today's flexible plastic substrates do not provide a sufficient moisture barrier and therefore an (additional) encapsulation from the substrate side is needed.

For providing or improving the moisture barrier, a thin-film encapsulation (TFE) is usually employed, consisting of or at least comprising a multilayer stack of inorganic/organic/inorganic materials. At the edge of the TFE, the organic material has to be sealed by at least one inorganic layer (better: inorganic/organic/inorganic stack) to avoid contact with air.

When an OLED, for example, provided on top of such TFE barrier layer on a flexible substrate is cut out of large area plastic substrates or out of the roll that is being used in a roll-to-roll process, the substrate encapsulation is damaged and a leakage path is opened up. In other words, upon cutting through OLEDs on a plastic foil substrate, the TFE barrier layer on the substrate side is damaged, and thus, from the sides, moisture can enter the organic layer. There the $H_2O$ molecules will be transported quickly over the whole area. If the moisture reaches, through a pinhole in the inner inorganic layer or the like, the OLED, the access results in a black spot, which will furthermore grow with time.

SUMMARY OF THE INVENTION

It is an object of the present invention to provide an encapsulated semiconductor device on a flexible substrate, in particular an encapsulated organic light emitting diode device on a flexible substrate overcoming the above drawbacks in the context of large area substrates or roll-to-roll processes. It is a further object of the present invention to provide for a method of at least partially encapsulating a semiconductor device like an organic light emitting diode device on a flexible substrate. The present invention aims at providing cuttable OLEDs, for example, to be cut out of a larger flexible substrate or in the context of a roll-to-roll process while reducing side leakage. Other encapsulated semiconductor devices, in particular photovoltaic and organic photovoltaic devices, are also foreseen.

In a first aspect of the present invention an encapsulated semiconductor device provided on a flexible substrate is presented, comprising an semiconductor diode arrangement and the substrate, wherein a barrier layer is provided between the semiconductor arrangement and the substrate and an encapsulation layer is provided at least partially covering the semiconductor arrangement, wherein the barrier layer successively comprises, in a direction from the flexible substrate towards the semiconductor arrangement, an outer inorganic barrier layer, an organic barrier layer, and an inner inorganic barrier layer, wherein the outer inorganic barrier layer extends beyond the organic barrier layer and a lateral surface of the encapsulation layer abuts a main surface of the outer inorganic barrier layer opposite the substrate.

An insight underlying the present invention is that by means of an appropriate preparation, the arrangement of the barrier layer and in particular the protection of the sandwiched organic layer against moisture may be preserved, such that the encapsulation layer is not simply provided on top of the semiconductor arrangement but cooperates with the barrier layer.

In a preferred embodiment, the semiconductor arrangement is an organic light emitting diode arrangement (OLED arrangement) or a photovoltaic arrangement (in particular an organic photovoltaic arrangement).

In a preferred embodiment, the encapsulation layer includes an outer inorganic encapsulation layer, an organic encapsulation layer and an inner inorganic encapsulation layer in this order.

It is advantageous to provide a multilayer structure also for the encapsulation layer. The organic layer provides a planarization (allowing for an improved surface and subsequent deposition of the inorganic layer having a higher quality) and absorbs mechanical stresses in the layer.

In a preferred embodiment, the organic barrier layer extends beyond the inner inorganic barrier layer and a lateral surface of the inner inorganic encapsulation layer abuts a main surface of the organic barrier layer opposite the substrate, a lateral surface of the organic barrier layer abutting a main surface of the organic encapsulation layer opposite the outer inorganic encapsulation layer.

In this embodiment, the organic layers of the encapsulation layer and the barrier layer are in contact, while completely surrounded by the combination of the outer inorganic barrier layer and the outer inorganic encapsulation layer.

In a preferred embodiment, the outer inorganic encapsulation layer, the outer inorganic barrier layer, the organic encapsulation layer and/or the organic barrier layer include a getter material arranged for extracting moisture from the organic encapsulation layer.

The contact between the organic layers results in that any moisture in the organic layers can travel throughout both, the organic barrier layer and the organic encapsulation layer. This may be used for effectively employing a moisture getter (like calcium oxide, for example). Due to the contact between the organic barrier layer and the organic encapsulation layer, a getter material provided in the outer inorganic encapsulation layer or organic encapsulation layer also draws moisture from the organic barrier layer. In case of light extraction from the substrate side, this allows for an additional versatility, as the getter material (for removing/catching moisture from the organic barrier layer) does not have to be transparent, as it may be provided opposite the substrate, for example.

In a preferred embodiment, a lateral surface of the organic barrier layer abuts an inner main surface of the encapsulation layer.

The encapsulation layer of this embodiment covers the side or lateral surface of the organic barrier layer and thus prevents moisture from reaching the organic barrier layer from the side.

In a preferred embodiment, at least one of the outer inorganic barrier layer, the inner inorganic barrier layer, the outer inorganic encapsulation layer and the inner inorganic encapsulation layer is made of one or more materials selected from the group consisting of $AlO_x$, $TiO_x$, $ZrO_x$, $ZnO$, $Zr_xO_y$, $MnO_x$, $HfO_x$, $SiN_x$ and $SiO_xN_y$.

The respective inner and outer inorganic layers may be made of different materials. The barrier layer and the encapsulation layer may be made of different materials or material combinations. It is however, to be noted that the use of the same composition and/or layer materials give the advantage of a reduction in complexity. A particularly preferred material for the inorganic layers is SiN.

In a preferred embodiment, the organic barrier layer and/or the organic encapsulation layer is made of one or more materials selected from the group consisting of monomers and polymers with planarization and/or soothing properties, preferable with cross-linkable properties. The organic layer preferably forms a thick layer of more 100 nm thickness which can smoothen defects or particle in the lower inorganic layer. The organic layer is preferably deposited with a printing technology like jetting or inkjet or coating technology like slit-coating, but also thermal evaporation or chemical vapors deposition can be applied.

The organic barrier layer and the organic encapsulation layer may be made of the same material (combination) or of different materials/material combinations.

In a preferred embodiment, a portion of the inner inorganic barrier layer and a portion of the organic barrier layer are selectively removed prior to the provision of the encapsulation layer.

The selective removal may be provided, for example, by an etching process, in particular a plasma etching process.

In another aspect of the present invention a method of providing an at least partially encapsulated semiconductor device on a flexible substrate is presented, comprising the steps of providing a semiconductor arrangement and a barrier layer on the substrate, the barrier layer successively comprising, in a direction from the flexible substrate (1) towards the semiconductor arrangement (13), an outer inorganic barrier layer, an organic barrier layer, and an inner inorganic barrier layer, wherein the outer inorganic barrier layer extends beyond the organic barrier layer, and encapsulating the semiconductor arrangement on the barrier layer by at least partially covering the semiconductor arrangement with an encapsulation layer such that and a lateral surface of the encapsulation layer abuts a main surface of the outer inorganic barrier layer opposite the substrate.

In a preferred embodiment, the providing of the semiconductor arrangement and the barrier layer includes providing the barrier layer on the substrate and selectively removing a portion of the inner inorganic barrier layer and a portion of the organic barrier layer.

In a preferred embodiment, the providing of the barrier layer on the substrate includes providing of the semiconductor arrangement on the barrier layer.

In this embodiment, the semiconductor arrangement is provided on the barrier layer prior to the selective removal of portions of the barrier layer.

It is possible to provide the semiconductor arrangement in a structured manner in such a way that the selective removal of portions of the barrier layer does not also result in a removal of portions of the semiconductor arrangement.

However, in a preferred embodiment, prior to the selective removing of a portion of the inner inorganic barrier layer and a portion of the organic barrier layer, a portion of the semiconductor arrangement provided on the barrier layer is selectively removed.

Here, in the process of removing portions of the stack on the substrate, also portions of the semiconductor arrangement are removed.

In a preferred embodiment, the providing of the organic light emitting diode arrangement and the barrier layer further includes providing the semiconductor arrangement on the barrier layer.

In this embodiment, the semiconductor arrangement is provided on the barrier layer after the partial removal thereof.

In a preferred embodiment, an encapsulation method is presented in which the organic layer of an inorganic/organic/inorganic multilayer barrier on a plastic foil as a substrate is removed at the edges of a semiconductor device like an OLED or an OPV. The edges are subsequently sealed with a standard TFE process to encapsulate the semiconductor arrangement (e.g. the OLED or the OPV). This enables cuttable semiconductor devices like OLEDs or OPVs that are cut out of a larger plastic substrate and gives a method to reduce side leakage in OLEDs or other semiconductor devices like OPVs that have been manufactured in a roll-to-toll process.

It shall be understood that the encapsulated semiconductor device of claim 1, the method of providing an at least partially encapsulated semiconductor device of claim 10, and the computer program of claim 15 have similar and/or identical preferred embodiments, in particular, as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF THE EMBODIMENTS

Figure 1:
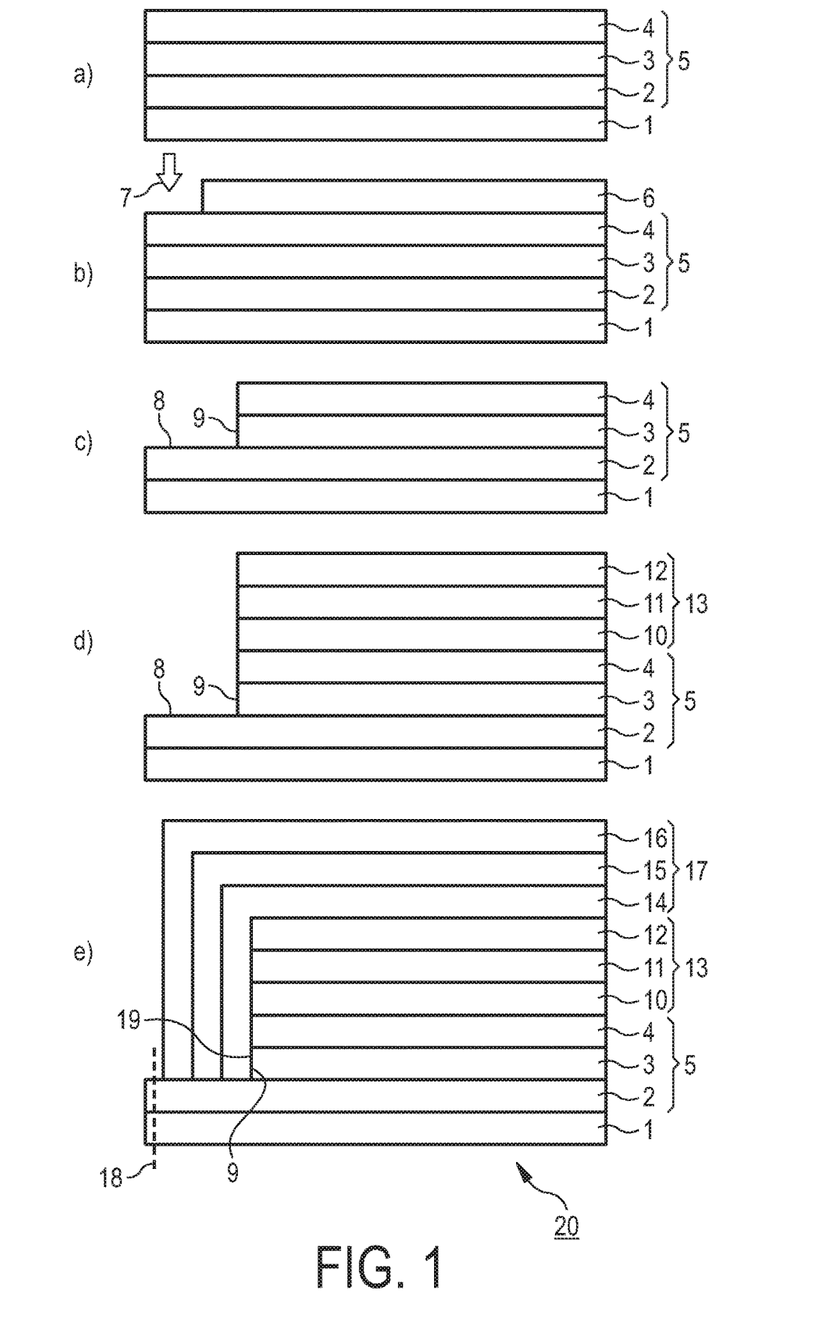
FIG. 1 illustrates a first concept for providing an encapsulated OLED device in accordance with an embodiment of the invention.

FIG. 1 illustrates a first concept for providing an encapsulated OLED device in accordance with an embodiment of the invention.

A barrier layer 5 is provided on a plastic foil 1 as a substrate. The barrier layer 5 includes an outer inorganic barrier layer 2 made of SiN, an organic barrier layer 3 and an inner inorganic barrier layer 4 (also made of SiN), as shown in FIG. 1a).

FIG. 1b) shows an organic etch mask 6 printed on top of the barrier 5 on a pre-defined area. In this case, the area left free by the etch mask 6 is at an edge of the plastic foil 1. As indicated by arrow 7, a SiN plasma etch process is applied to remove a part of the upper SiN layer (the inner inorganic layer 4) at the non-covered area. After that a second organic plasma etch process (not shown) is applied which removes a part of the organic barrier layer 3 of the barrier stack 5 and the organic etch mask 6 at the same time. After plasma etching the organic barrier layer 3 is fully removed from the edge of the foil 1, as shown in FIG. 1c).

In the following an OLED arrangement 13 is deposited on top of the barrier layer 5. The OLED includes, as conventionally known, an ITO layer 10, an OLED layer 11 and an Al layer 12 (FIG. 1e)). It is noted that also other electrodes for cathode and or anode may be used, in particular other transparent electrodes. As an alternative arrangement, also an inverted OLED may be provided.

It is to be noted that the OLED layer 11 is provided as a stack of sub-layers (not shown). As the skilled person is familiar with details of such OLED layers and such arrangements in general, a detailed discussion thereof is omitted here.

Finally an encapsulation layer in form of a TFE (inorganic/organic/inorganic stack) 17 is deposited which covers both the OLED arrangement 13 and the edge of the barrier layer 5 on the foil 1. The TFE 17 includes an inner inorganic encapsulation layer 14 made of SiN, an organic encapsulation layer 15 and an outer inorganic encapsulation layer 16.

As it can be seen in FIG. 1c), the selective removal of a part of the inner barrier layer 4 and a part of the organic barrier layer 3 results in the outer inorganic barrier layer 2 extending beyond the organic barrier layer 3, such that a main surface 8 of the outer inorganic barrier layer 2 opposite the foil 1 is exposed, together with a lateral surface 9 of the organic barrier layer 3.

After the provision of the TFE 17, the lateral surface 9 of the organic barrier layer 3 is covered by the inner surface 19 of the TFE 17, thus preventing the organic barrier layer 3 from being exposed to air or other sources of moisture and the like.

The previously exposed main surface 8 of the outer organic barrier layer 2 is now at least partially in covering contact with a lateral surface of the encapsulation layer 17.

The resulting encapsulated OLED 20 may be cut, for example, as illustrated by section line 18 in FIG. 1e), without compromising the integrity of the barrier layer 5 or the encapsulation layer 17.

Figure 2A:
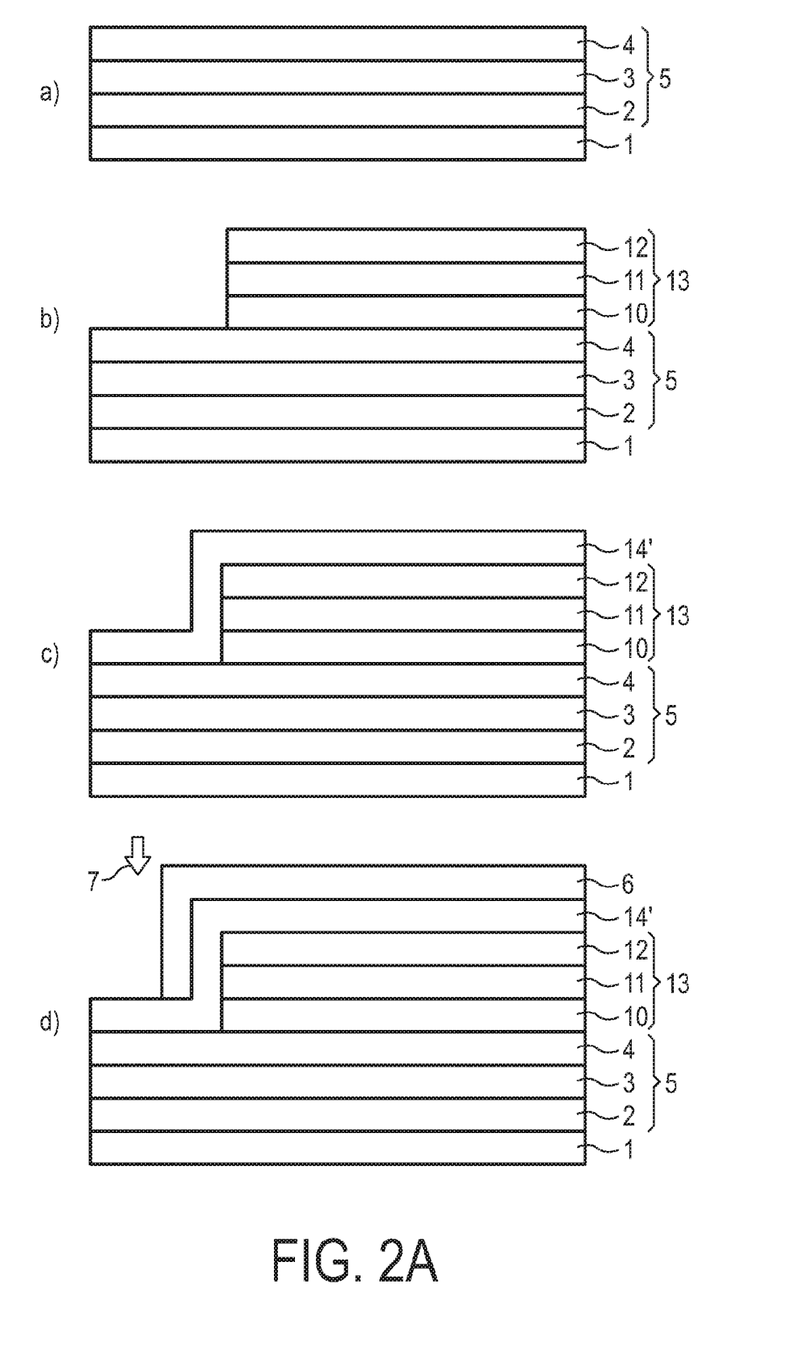
FIGS. 2A and 2B illustrate a second concept for providing an encapsulated OLED device in accordance with another embodiment of the invention.
Figure 2B:
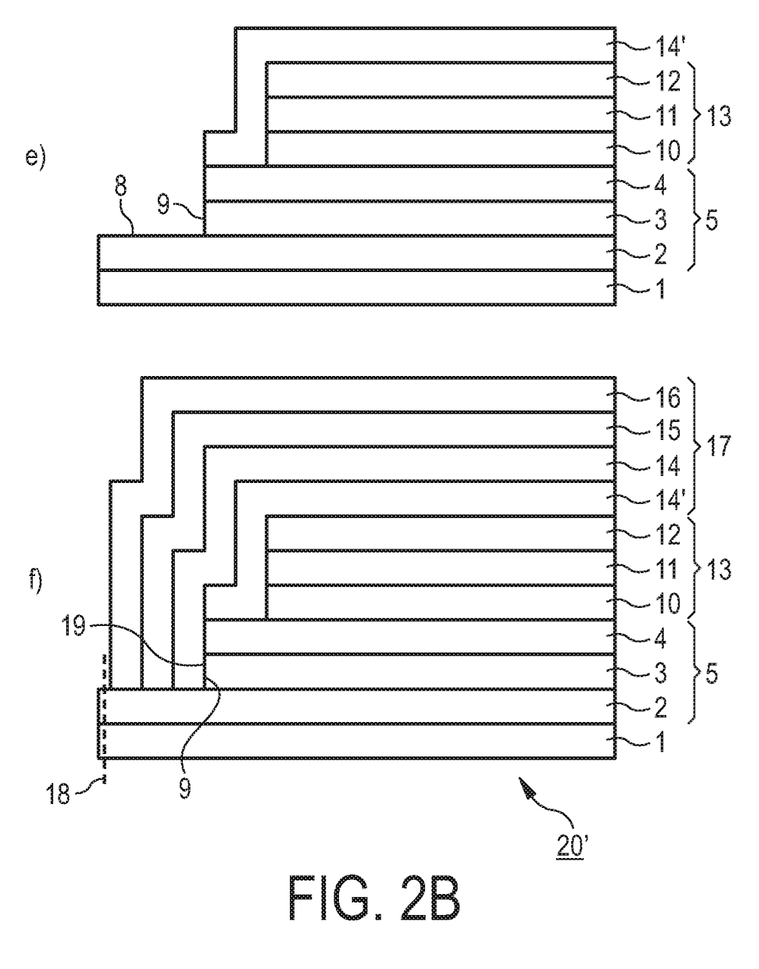

FIGS. 2A and 2B illustrate a second concept for providing an encapsulated OLED device in accordance with another embodiment of the invention.

As illustrated in FIG. 2A a) a barrier layer 5 including an outer barrier layer 2 made of SiN, an organic barrier layer 3 and an inner barrier layer 4 made of SiN is provided on a foil 1. On top of the unstructured barrier layer 5, a pre-defined OLED arrangement 13 is deposited as shown in FIG. 2A b). As discussed above, the OLED arrangement 13 includes an ITO layer 10, an OLED layer 11 and an Al layer 12.

The exposed surfaces of the barrier layer 5 on the foil 1 and of the OLED arrangement 13 are then covered by another SiN layer 14' (FIG. 2A c)).

After that an organic etch mask 6 is printed on top of the SiN layer 14' on a pre-defined area (here again pictured as an opening at one edge of the plastic foil 1). Then, as illustrated by arrow 7 in FIG. 2A d), a SiN plasma etch process is applied to selectively remove the upper SiN layer 14' and the inner barrier layer 4 from the non-covered area. After that a second organic plasma etch process (not shown) is applied which removes a portion of the organic barrier layer 3 and the organic etch mask 6 at the same time.

After plasma etching, the organic barrier layer 3 is fully removed from the edge of the foil, as shown in FIG. 2B e), resulting in the main surface 8 of the outer barrier layer 2 opposite the foil 1 and the lateral surface 9 of the organic barrier layer 3 being exposed.

Finally, a TFE 17 (inorganic/organic/inorganic stack of inner encapsulation layer 14 made of SiN, organic encapsulation layer 15 and outer encapsulation layer 16 made of SiN) is deposited which covers both the OLED arrangement 13 and the edge of the barrier layer 5 on the foil 1.

The resulting encapsulated OLED 20' may be cut, for example, as illustrated by section line 18 in FIG. 2B f), without compromising the integrity of the barrier layer 5 or the encapsulation layer 17.

Figure 3A:
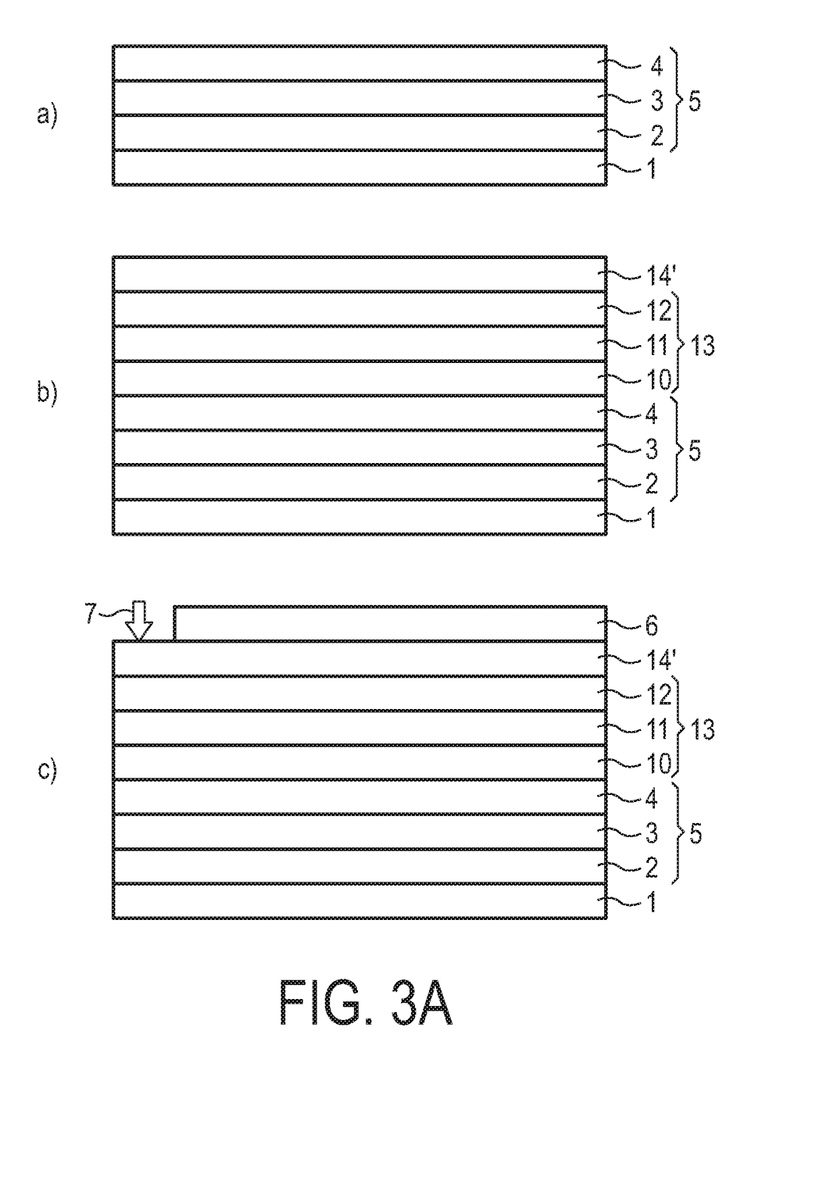
FIGS. 3A and 3B illustrate a third concept for providing an encapsulated OLED device in accordance with a further embodiment of the invention.
Figure 3B:
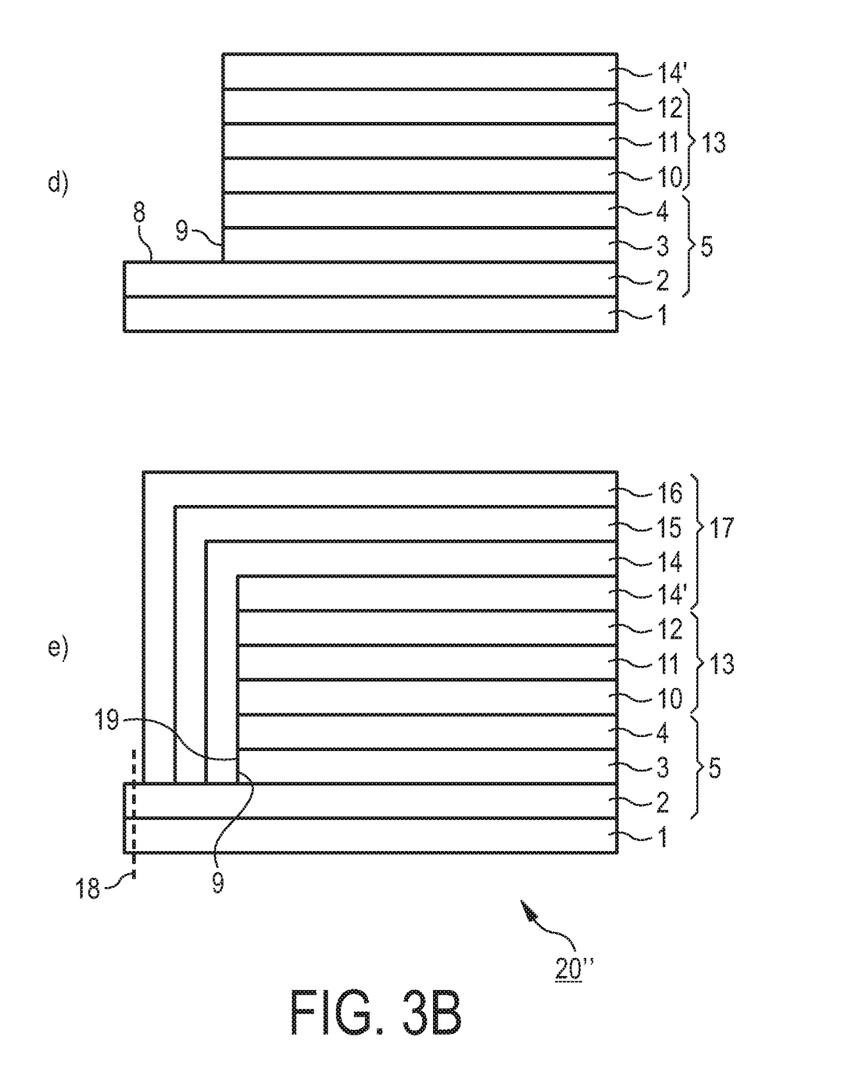

FIGS. 3A and 3B illustrate a third concept for providing an encapsulated OLED device in accordance with a further embodiment of the invention.

As illustrated in FIG. 3A a) a barrier layer 5 including an outer barrier layer 2 made of SiN, an organic barrier layer 3 and an inner barrier layer 4 made of SiN is provided on a foil 1. On top of the unstructured barrier layer 5, an OLED arrangement 13 is deposited as shown in FIG. 3A b). As discussed above, the OLED arrangement 13 includes an ITO layer 10, an OLED layer 11 and an Al layer 12. In contrast to the case of FIGS. 2A and 2B, the OLED arrangement 13 of FIGS. 3A and 3B is not structured. On top of the OLED arrangement 13 an unstructured SiN layer 14' is provided.

As shown in FIG. 3A c), an organic etch mask 6 is printed on top of the SiN layer 14' in a pre-defined area (here, as with FIGS. 1 and 2, illustrated as an opening at one edge of the plastic foil 1).

Similar to the case of FIGS. 2A and 2B, in the following, a plasma etch process (indicated by arrow 7) is applied which consecutively removes selected portions of the SiN layer 14', the Al layer 12, the OLED layer 11, the ITO layer 10, the inner barrier layer 4 and the organic barrier layer 3 (see FIG. 3B d)). During this etch procedure also the etch mask 6 is removed. After plasma etching the organic barrier layer 3 is fully removed from the edge of the foil 1.

Finally, as shown in FIG. 3B e), a TFE 17 (inorganic/organic/inorganic stack of inner encapsulation layer 14 made of SiN, organic encapsulation layer 15 and outer encapsulation layer 16 made of SiN) is deposited which covers both the OLED arrangement 13 and the edge of the barrier layer 5 on the foil 1.

The resulting encapsulated OLED 20" may be cut, for example, as illustrated by section line 18 in FIG. 3B e), without compromising the integrity of the barrier layer 5 or the encapsulation layer 17.

Figure 4:
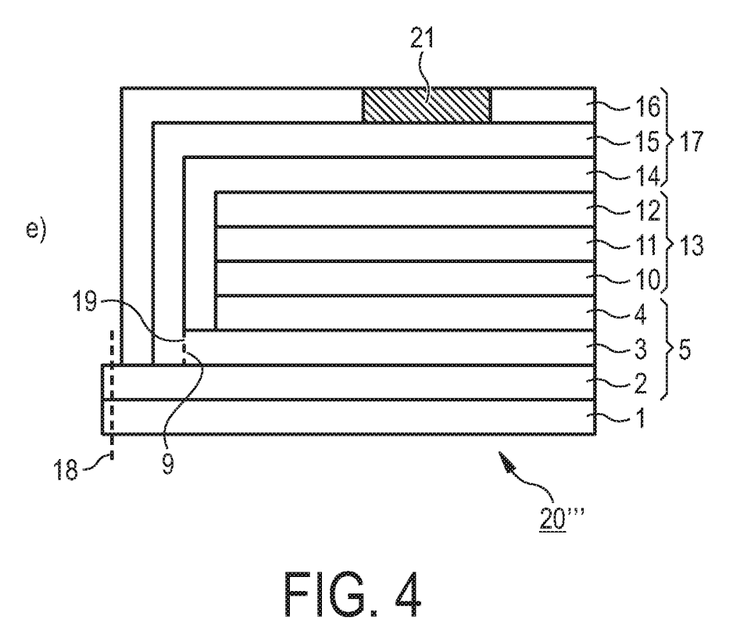
FIG. 4 shows an encapsulated OLED device in accordance with yet a further embodiment of the invention.

FIG. 4 shows an encapsulated OLED device 20''' in accordance with yet a further embodiment of the invention.

The encapsulated OLED device 20''', which is provided on a plastic foil substrate 1 and includes a barrier layer 5, an OLED arrangement 13 and an encapsulation layer 17 is obtained in a manner similar to those corresponding to FIG. 1 to 3.

Similar to the cases of FIG. 1 to 3, the encapsulated OLED 20''' may be cut, for example, as illustrated by section line 18, without compromising the integrity of the barrier layer 5 or the encapsulation layer 17.

The internal structures of the barrier layer 4, the OLED arrangement 13 and the encapsulation layer 17 substantially correspond to those of the OLED devices 20, 20', and 20" discussed above.

However, in contrast to the other OLED devices 20, 20', 20", the organic barrier layer 3 and the organic encapsulation layer 15 are in contact (surfaces 9 and 19).

Furthermore, the outer inorganic encapsulation layer 16 includes a getter portion 21 for absorbing moisture from the organic encapsulation layer 15.

As the organic encapsulation layer 15 and the organic barrier layer 3 are in contact, the removal of moisture from the organic encapsulation layer 15 also results in a reduction of moisture in the organic barrier layer 3, as any moisture in the organic layers 3, 15 tends to be evenly distributed throughout the organic layers 3, 15.

Figure 5:
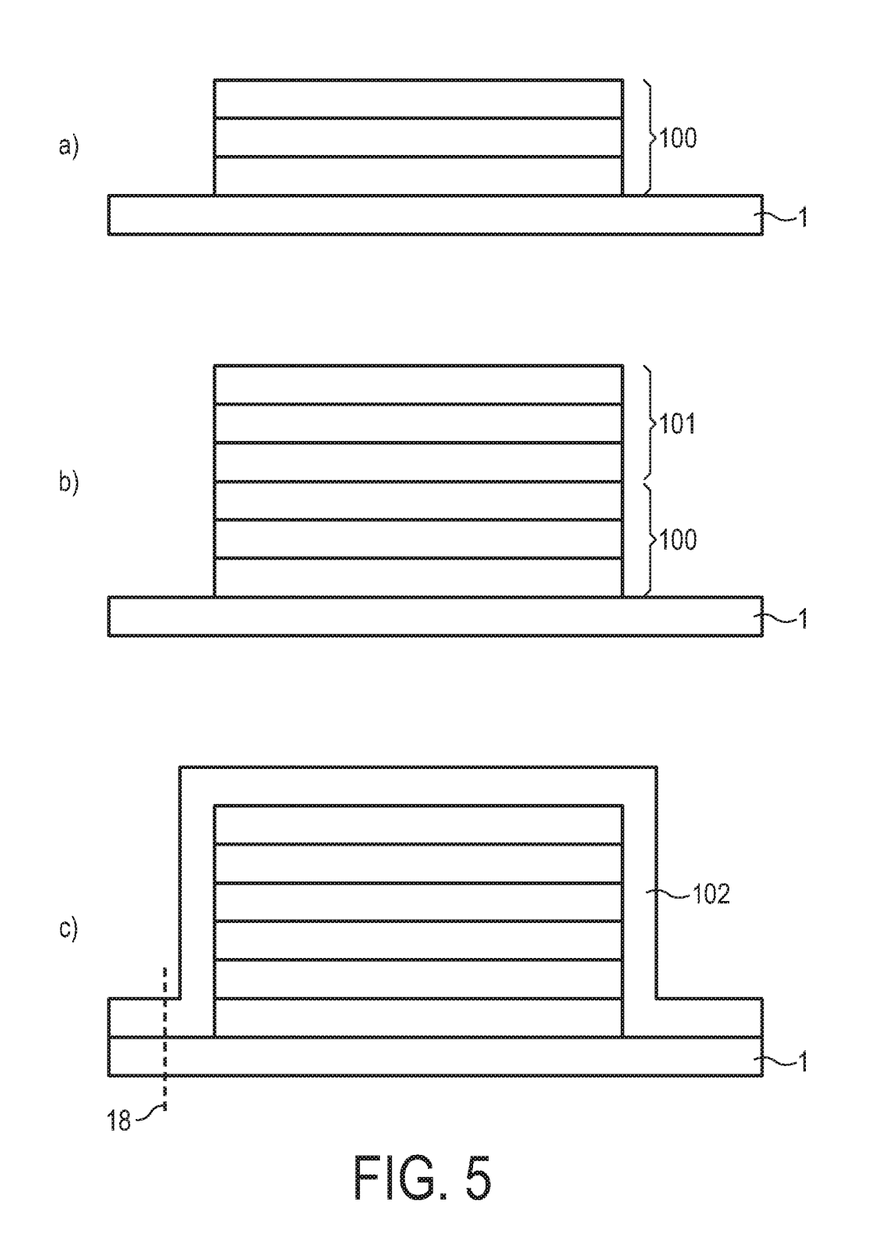
FIG. 5 illustrates a conventional concept for providing an encapsulated OLED device.

FIG. 5 illustrates a conventional concept for providing an encapsulated OLED device.

On top of a plastic substrate 1, a structured barrier layer 100 made of an inorganic/organic/inorganic stack is provided (FIG. 4a)). The lateral surfaces of the organic layer of the barrier layer 100 are exposed.

On top of the barrier layer 100, a structured OLED arrangement 101 is provided (including an ITO layer, an OLED layer and an Al layer).

In order to prevent air or moisture from reaching the organic layer of the barrier layer 100 and the OLED arrangement 101, an encapsulation layer 102 is provided on top.

In this case, it is not possible to provide the encapsulation layer 102 as an inorganic/organic/inorganic stack as the organic layer of such stack would be exposed to the air.

Only due to the structuring of the barrier layer 100 and the OLED arrangement, the OLED device may be cut, for example at section 18.

The implementation of such approach in the context of large area substrates or roll-to-roll-processes suffers from the disadvantage that the barrier layer has to be pre-structured.

Figure 6A:
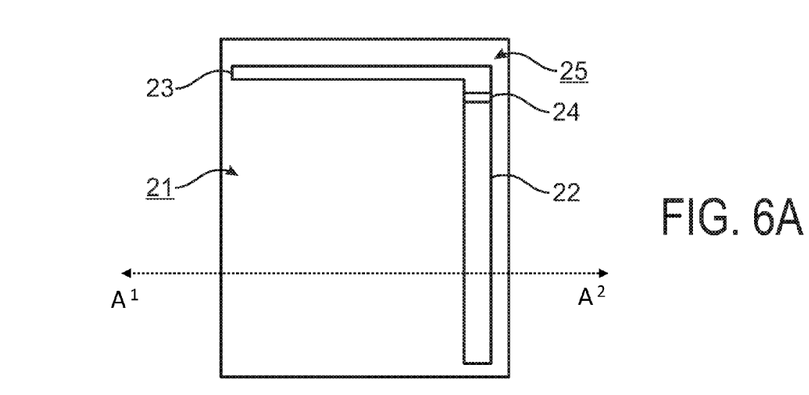
FIGS. 6A and 6B illustrate an encapsulated OLED device in accordance with an embodiment of the invention including a contact area.
Figure 6B:
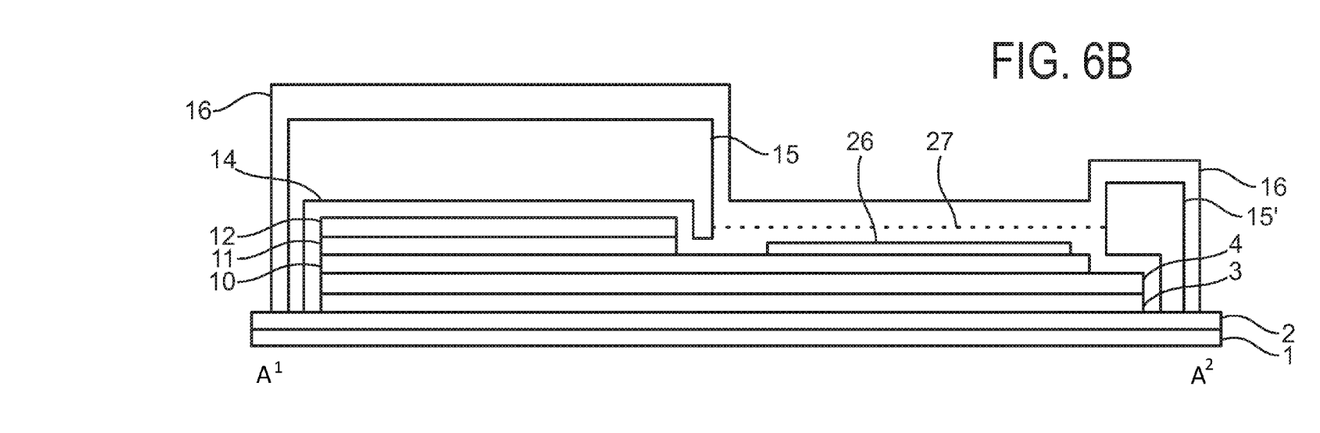

FIGS. 6A and 6B illustrate an encapsulated OLED device in accordance with an embodiment of the invention including a contact area.

FIG. 6A shows a schematic plan view of an encapsulated OLED device in accordance with an embodiment of the invention. The OLED device includes an active area 21, adjacent to which an anode contact area 22 and a cathode contact area 23 are provided (separated by an isolation area 24). At the edge area 25 of the OLED device, an organic layer is provided (as discussed above) embedded between inorganic layers. Regardless of the details of this embodiment, it is to be noted that also more contacts may be provided, e.g. for displays many more anode and cathode contacts are required and these can also be on all sides of the active area.

FIG. 6B shows a schematic cross section of the encapsulated OLED device of FIG. 6A along the line $A^1$-$A^2$.

On a flexible substrate 1 (plastic foil) an barrier layer is provided including an outer inorganic barrier layer 2 (made of SiN), an organic barrier layer 3 and an inner inorganic barrier layer 4 (also made of SiN).

On the inner inorganic barrier layer 4, the OLED arrangement is provided, including an ITO layer 10, an OLED layer 11 and an Al layer 12. The OLED layer 11 and the Al layer 12 are provided in the active area 21 (see FIG. 6A), whereas the ITO layer 10 extends also into the anode contact area 22 (see FIG. 6A). In the anode contact area 22, on top of the ITO layer 10 a metal contact layer 26 may be provided (even though a contact may also be provided without the metal contact layer 26).

As discussed above, at the edges of the barrier layer, the organic barrier layer 3 and the inner inorganic barrier layer 4 are partially removed (in comparison to the outer inorganic barrier layer 2), whereas the thus exposed lateral surfaces of the organic barrier layer 3 and the inner inorganic barrier layer 4 as well as the OLED arrangement and the metal contact layer 25 are covered by an encapsulation layer.

In the active area 21, the encapsulation layer includes an inner inorganic encapsulation layer 14, an organic encapsulation layer 15 and an outer inorganic encapsulation layer 16. In the edge area 25, the encapsulation layer also includes the inner inorganic encapsulation layer 14, an organic encapsulation layer 15' (not necessarily continuous with the encapsulation layer 15) and the outer inorganic encapsulation layer 16. In the anode contact area 22 (as well as the cathode contact area 23, see FIG. 6A), no organic encapsulation layer is provided and just the inner and outer inorganic encapsulation layers 14, 16 are provided (as suggested by line 27), even though the contact area may also be provided in such a way that the ITO layer 10 or the metal contact layer 26 are exposed. The inner and outer inorganic encapsulation layers 14, 16 are made of SiN in this embodiment.

In case the ITO layer 10 and the metal contact layer 26 (if provided) are covered by the inorganic layer(s) 14, 16 of the encapsulation layer, it is possible, for example, to locally provide a through hole or the like by means of a laser going through the inorganic encapsulation layers in order to contact the ITO layer 10 and/or the metal contact layer 26.

Figure 7:
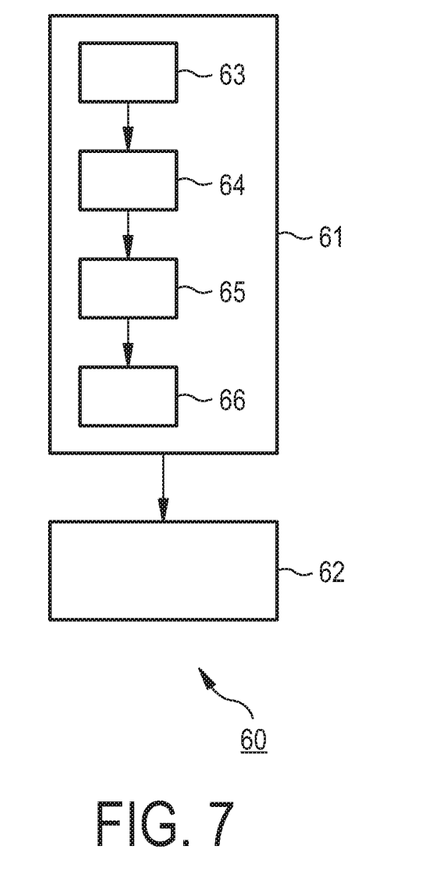
FIG. 7 shows a flow diagram schematically illustrating a method of providing an at least partially encapsulated organic light emitting diode device according to an embodiment of the invention.

FIG. 7 shows a flow diagram schematically illustrating a method of providing an at least partially encapsulated organic light emitting diode device according to an embodiment of the invention.

The method 60 of providing an at least partially encapsulated organic light emitting diode device on a flexible substrate comprises the following steps.

An organic light emitting diode arrangement and a barrier layer are provided in a providing step 61 on the substrate, wherein the barrier layer includes an organic barrier layer interposed between an outer inorganic barrier layer and an inner inorganic barrier layer, wherein the outer inorganic barrier layer extends beyond the organic barrier layer.

Following the providing step 61, an encapsulation step 62 is provided, encapsulating the OLED arrangement on the barrier layer by at least partially covering the OLED arrangement with an encapsulation layer such that and a lateral surface of the encapsulation layer abuts a main surface of the outer inorganic barrier layer opposite the substrate.

The providing step 61 includes a barrier layer provision step 63 of providing the barrier layer on the substrate, followed by an OLED arrangement step 64 of providing of the OLED arrangement on the barrier layer, followed by an OLED removal step 65 of selectively removing a portion of the OLED arrangement provided on the barrier layer and a barrier removal step 66 of selectively removing a portion of the inner inorganic barrier layer and a portion of the organic barrier layer.

Figure 8:
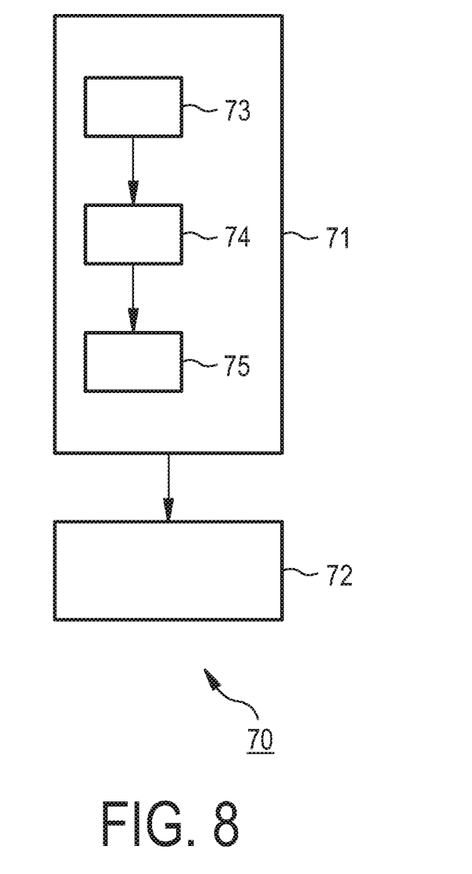
FIG. 8 shows a flow diagram schematically illustrating a method of providing an at least partially encapsulated organic light emitting diode device according to another embodiment of the invention.

FIG. 8 shows a flow diagram schematically illustrating a method of providing an at least partially encapsulated organic light emitting diode device according to another embodiment of the invention.

The method 70 of providing an at least partially encapsulated organic light emitting diode device on a flexible substrate, comprises the following steps.

An organic light emitting diode arrangement and a barrier layer on the substrate are provided in a providing step 71, wherein the barrier layer includes an organic barrier layer interposed between an outer inorganic barrier layer and an inner inorganic barrier layer, wherein the outer inorganic barrier layer extends beyond the organic barrier layer.

The providing step 71 is followed by an encapsulation step 72 of encapsulating the OLED arrangement on the barrier layer by at least partially covering the OLED arrangement with an encapsulation layer such that and a lateral surface of the encapsulation layer abuts a main surface of the outer inorganic barrier layer opposite the substrate.

The providing step 71 includes a barrier layer provision step 73 of providing the barrier layer on the substrate and barrier removal step 74 of selectively removing a portion of the inner inorganic barrier layer and a portion of the organic barrier layer. Following the barrier removal step 74, in an OLED provision step 75, the OLED arrangement is provided on the barrier layer.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

The TFE layers discussed in detail in this application include just an outer inorganic layer, an organic layer and an inner inorganic layer (in this order). However, in the context of the invention the barrier and/or encapsulation layer may be more complex, i.e. may include several organic and inorganic layers in a stack.

In the process of selectively removing portions of one or more layers and the subsequent provision of one or more layers, there is the possibility of the occurrence of voids due to an excessive removal. As to the contact or abutment of layers discussed in the present application, the presence of voids in practical implementation is to be disregarded.

According to embodiments of the present invention, a plasma etch process which is locally applied on a barrier layer on a substrate. The barrier layer consists of an inorganic/organic/inorganic multilayer stack. The plasma etch process removes the organic layer of the barrier layer at the edges of an OLED. The edges are then sealed with the standard TFE process for encapsulating the OLED. The process can be applied directly on the barrier layer on the foil or on a final OLED on the barrier layer on the substrate.

The above embodiments discussed with respect to the drawings relate specifically to the case that the semiconductor device (or semiconductor arrangement) is an organic light emitting diode device (or organic light emitting diode arrangement). Even though the present invention may be provided with particular benefit in the context of OLEDs on flexible substrates, the invention is not limited to just OLEDs as examples of semiconductor devices. Other semiconductor devices may also be provided in the context of the present invention, in particular photovoltaic devices and specifically organic photovoltaic devices. Even though the details of, for example, organic photovoltaic devices differ from those of an OLED device, the skilled person will appreciate how to implement the present invention also in the context of such other semiconductor devices.

In the claims, the word "comprising" does not exclude other elements or steps, and the indefinite article "a" or "an" does not exclude a plurality.

A single processor, device or other unit may fulfill the functions of several items recited in the claims. The mere fact that certain measures are recited in mutually different dependent claims does not indicate that a combination of these measures cannot be used to advantage.

Operations for the computer-implemented control of the methods according to the invention can be implemented as program code means of a computer program and/or as dedicated hardware.

A computer program may be stored and/or distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention claimed is:

1. An encapsulated semiconductor device comprising a flexible substrate and a semiconductor arrangement provided on the flexible substrate,
   wherein a barrier layer is provided between the semiconductor arrangement and the flexible substrate and an encapsulation layer is provided at least partially covering the semiconductor arrangement,
   wherein the barrier layer successively comprises, in a direction from the flexible substrate towards the semiconductor arrangement, an outer inorganic barrier layer, an organic barrier layer, and an inner inorganic barrier layer,
   wherein the encapsulation layer includes an outer inorganic encapsulation layer, an organic encapsulation layer and an inner inorganic encapsulation layer in this order;
   wherein the outer inorganic barrier layer extends beyond the organic barrier layer and a lateral surface of the organic encapsulation layer and the outer inorganic encapsulation layer abuts a main surface of the outer inorganic barrier layer opposite the substrate;
   wherein the organic barrier layer extends beyond the inner inorganic barrier layer and a lateral surface of the inner inorganic encapsulation layer of the encapsulation layer abuts a main surface of the organic barrier layer opposite the substrate, a lateral surface of the organic barrier layer abutting a main surface of the organic encapsulation layer opposite the outer inorganic encapsulation layer.

2. The semiconductor device according to claim 1, wherein the outer inorganic encapsulation layer, the outer inorganic barrier layer, the organic encapsulation layer and/or the organic barrier layer include a getter material arranged for extracting moisture from the organic encapsulation layer.

3. The semiconductor device according to claim 1, wherein at least one of the outer inorganic barrier layer, the inner inorganic barrier layer, the outer inorganic encapsulation layer and the inner inorganic encapsulation layer is made of one or more materials selected from the group consisting of $AlO_x$, $TiO_x$, $ZrO_x$, $ZnO$, $Zr_xO_y$, $MnO_x$, $HfO_x$, $SiN_x$ and $SiO_xN_y$.

4. The semiconductor device according to claim 1, wherein the organic barrier layer and/or the organic encapsulation layer is made of one or more materials selected from the group consisting of monomers and polymers with planarization and/or smoothing properties.

5. The semiconductor device according to claim 1, wherein semiconductor arrangement is an organic light emitting diode arrangement or an organic photovoltaic arrangement.

6. The semiconducting device according to claim 1, wherein the inner and outer inorganic layers of the barrier layer are made of different materials.

7. A method of providing an at least partially encapsulated semiconductor device on a flexible substrate, comprising the steps of:
  providing a semiconductor arrangement and a barrier layer on the flexible substrate, the barrier layer successively comprising, in a direction from the flexible substrate towards the semiconductor arrangement, an outer inorganic barrier layer, an organic barrier layer, and an inner inorganic barrier layer, wherein the outer inorganic barrier layer extends beyond the organic barrier layer; and
  encapsulating the semiconductor arrangement on the barrier layer by at least partially covering the semiconductor arrangement with an encapsulation layer wherein the encapsulation layer includes an outer inorganic encapsulation layer, an organic encapsulation layer and an inner inorganic encapsulation layer in this order such that a lateral surface of the organic encapsulation layer and the outer inorganic encapsulation layer abuts a main surface of the outer inorganic barrier layer opposite the substrate wherein the organic barrier layer extends beyond the inner inorganic barrier layer and a lateral surface of the inner inorganic encapsulation layer abuts a main surface of the organic barrier layer opposite the substrate, a lateral surface of the organic barrier layer abutting a main surface of the organic encapsulation layer opposite the outer inorganic encapsulation layer.

8. The method according to claim 7, wherein the step of providing the semiconductor arrangement and the barrier layer includes providing the barrier layer on the substrate and selectively removing a portion of the inner inorganic barrier layer and a portion of the organic barrier layer.

9. The method according to claim 8, wherein prior to selectively removing a portion of the inner inorganic barrier layer and a portion of the organic barrier layer, a portion of the semiconductor arrangement provided on the barrier layer is selectively removed.

10. The method according to claim 8, wherein the step of providing the semiconductor arrangement and the barrier layer further includes providing the semiconductor arrangement on the barrier layer.

11. The method according to claim 7, wherein the step of providing the semiconducting arrangement and the barrier layer includes providing the inner and outer inorganic layers of the barrier layer as different materials.

* * * * *